United States Patent
Plesski et al.

(10) Patent No.: US 11,835,414 B2
(45) Date of Patent: *Dec. 5, 2023

(54) PASSIVE PRESSURE SENSOR WITH A PIEZOELECTRIC DIAPHRAGM AND A NON-PIEZOELECTRIC SUBSTRATE

(71) Applicant: MURATA MANUFACTURING CO., LTD, Kyoto (JP)

(72) Inventors: Viktor Plesski, Gorgier (CH); Soumya Yandrapalli, Lausanne (CH); Julius Koskela, Helsinki (FI); Ventsislav Yantchev, Sofia (BG)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 68 days.

This patent is subject to a terminal disclaimer.

(21) Appl. No.: 17/370,727

(22) Filed: Jul. 8, 2021

(65) Prior Publication Data

US 2021/0333166 A1 Oct. 28, 2021

Related U.S. Application Data

(63) Continuation-in-part of application No. 16/664,398, filed on Oct. 25, 2019, now Pat. No. 11,143,561.

(60) Provisional application No. 62/775,594, filed on Dec. 5, 2018.

(51) Int. Cl.
*G01L 9/08* (2006.01)
*G01L 19/08* (2006.01)
*G01L 9/00* (2006.01)
*H03H 9/17* (2006.01)

(52) U.S. Cl.
CPC .......... *G01L 9/0022* (2013.01); *G01L 19/086* (2013.01); *H03H 9/174* (2013.01)

(58) Field of Classification Search
CPC ........ G01L 9/0025; G01L 9/008; G01L 1/165
See application file for complete search history.

(56) References Cited

U.S. PATENT DOCUMENTS

| | | |
|---|---|---|
| 3,978,731 A | 9/1976 | Reeder |
| 4,535,632 A | 8/1985 | Sinha |
| 6,507,983 B1 | 1/2003 | Ruby |
| 7,017,416 B1 | 3/2006 | Liu |
| 7,847,656 B2 | 12/2010 | Ayazi |
| 2005/0156484 A1 | 7/2005 | Cherednick et al. |
| 2005/0231067 A1 | 10/2005 | Cook |
| 2006/0130585 A1 | 6/2006 | Magee |
| 2007/0113658 A1* | 5/2007 | Combi .................. G01L 9/0025 73/702 |
| 2008/0211344 A1* | 9/2008 | Kando ................ H03H 9/0222 310/313 R |

(Continued)

*Primary Examiner* — Herbert K Roberts
(74) *Attorney, Agent, or Firm* — ARENTFOX SCHIFF LLP

(57) ABSTRACT

There are disclosed pressure-sensitive acoustic resonators and remote pressure sensing systems and methods. A pressure-sensitive acoustic resonator includes a conductor pattern formed on a planar surface of a non-piezoelectric substrate, the conductor pattern including an interdigital conductor pattern (ICP); and a diaphragm, the diaphragm being a portion of a plate of single-crystal piezoelectric material, the diaphragm having a front surface exposed to an environment and a back surface facing, but not contacting, the ICP.

24 Claims, 12 Drawing Sheets

Section B'-B'

(56) References Cited

U.S. PATENT DOCUMENTS

| | | |
|---|---|---|
| 2009/0009028 A1* | 1/2009 | Nishiyama ......... H03H 9/02559 |
| | | 310/313 B |
| 2010/0282005 A1 | 11/2010 | Kwon |
| 2012/0242190 A1 | 9/2012 | Choi |
| 2013/0021305 A1 | 1/2013 | Zuo et al. |
| 2018/0152171 A1* | 5/2018 | Kishimoto ............... H03H 9/25 |
| 2018/0335350 A1 | 11/2018 | Monedero Miranda |
| 2018/0372563 A1* | 12/2018 | Rogers ................. H01Q 9/0428 |
| 2020/0328823 A1* | 10/2020 | Nakagawa .......... H01L 41/0472 |
| 2021/0100513 A1 | 4/2021 | Bahmanyar et al. |

* cited by examiner

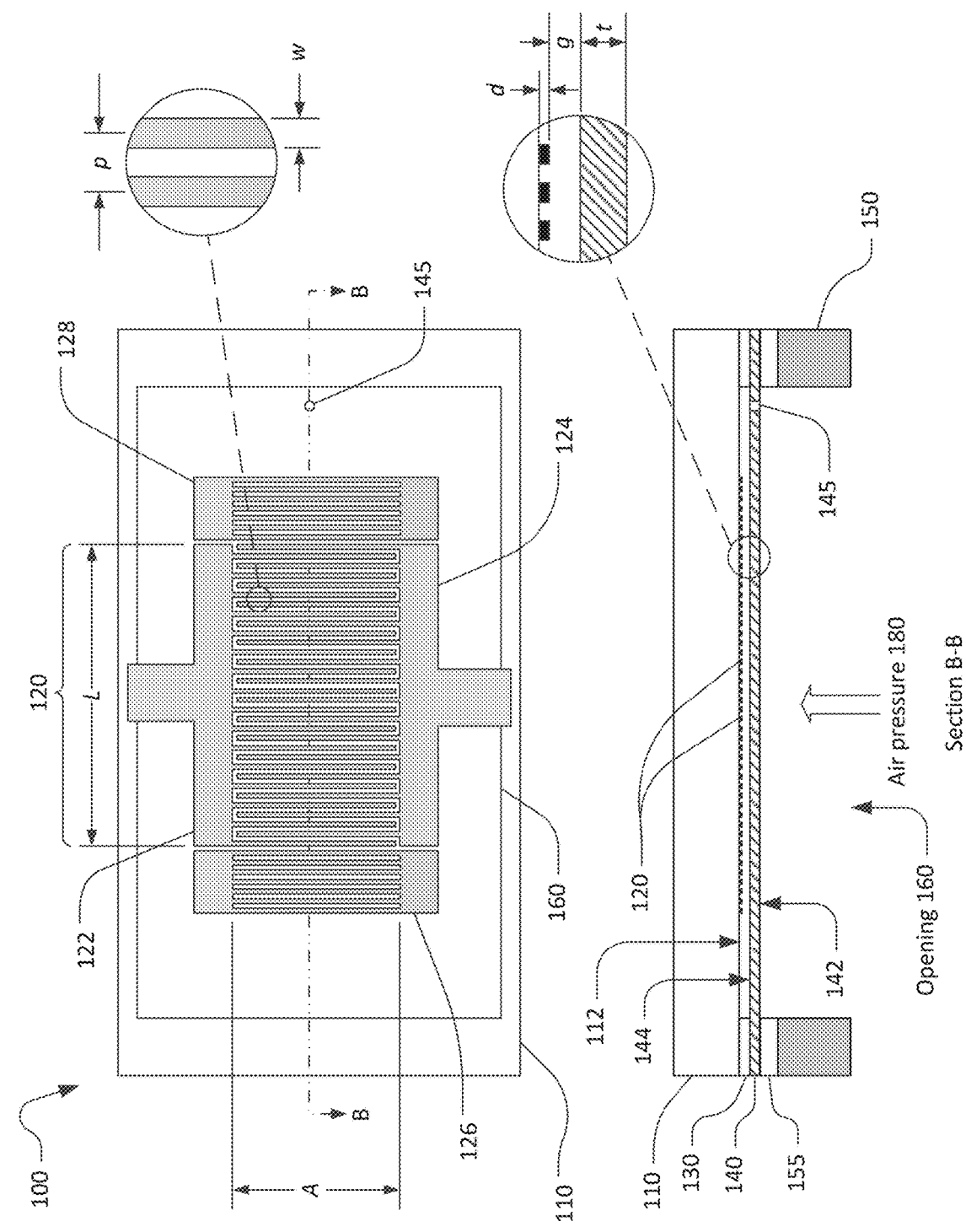

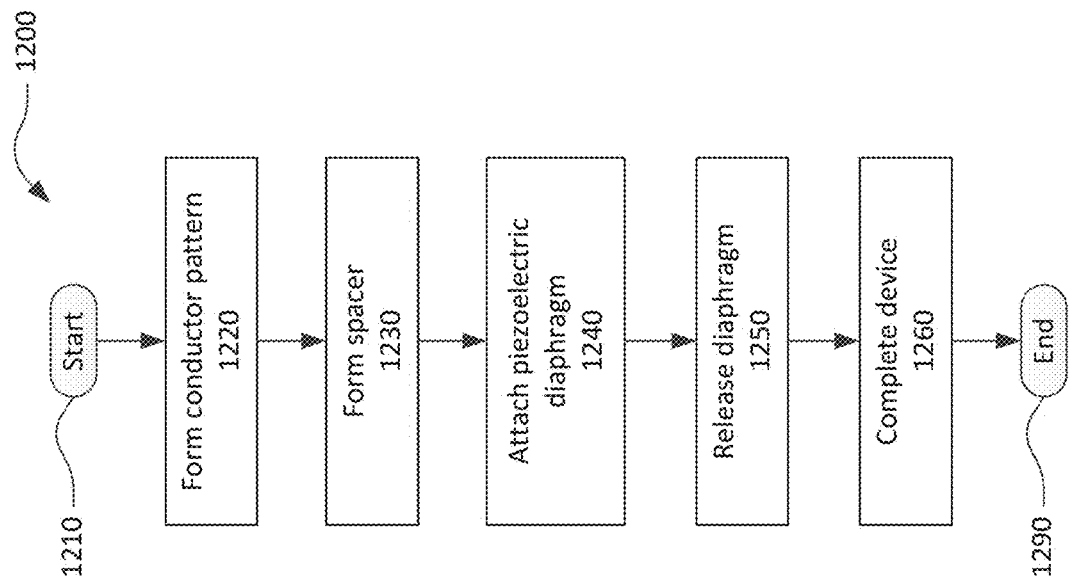
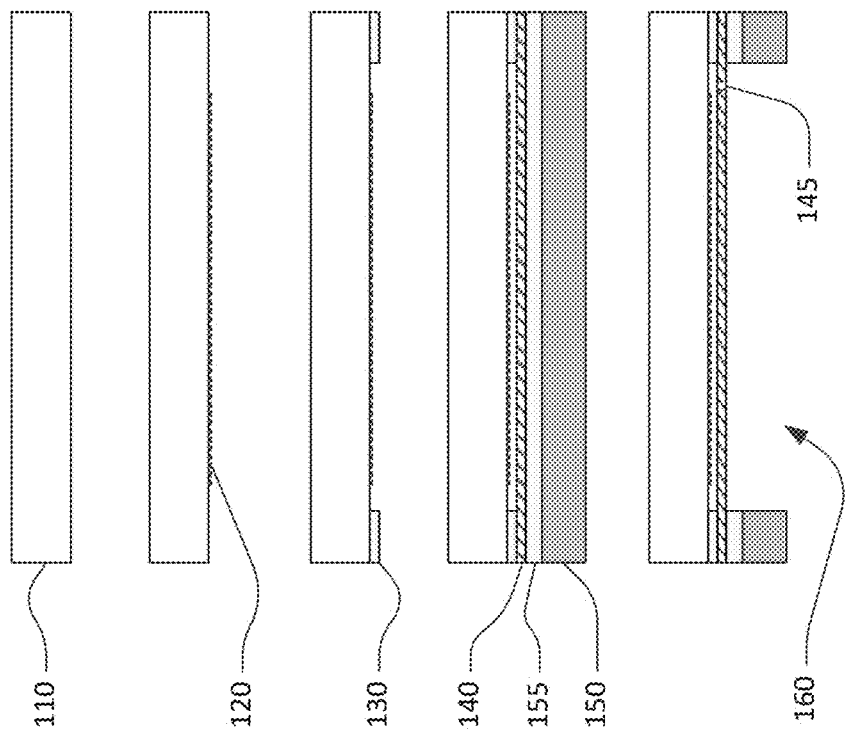
FIG. 12

PASSIVE PRESSURE SENSOR WITH A PIEZOELECTRIC DIAPHRAGM AND A NON-PIEZOELECTRIC SUBSTRATE

RELATED APPLICATION INFORMATION

This application is a continuation-in-part of application Ser. No. 16/664,398, filed Oct. 25, 2019, titled PASSIVE MICROPHONE/PRESSURE SENSOR USING A PIEZOELECTRIC DIAPHRAGM, which claims priority from Provisional Patent Application No. 62/775,594, filed Dec. 5, 2018, titled PRESSURE SENSOR AND MICROPHONE BASED ON THIN PIEZOELECTRIC CRYSTAL MEMBRANE. All of these applications are incorporated herein by reference.

Portions of this application are related to co-pending application Ser. No. 16/203,443, filed Dec. 21, 2018, titled TRANSVERSELY-EXCITED FILM BULK ACOUSTIC RESONATOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This application relates to passive pressure and/or acoustic sensors than can be wirelessly interrogated.

Description of the Related Art

Remotely interrogatable passive sensors may be used in a variety of situations where direct physical measurements are not possible or practical. For example, remotely interrogatable passive sensors may be used to conduct covert surveillance or to measure phenomenon in hazardous or otherwise inaccessible environments.

DESCRIPTION OF THE DRAWINGS

FIG. 1A is schematic cross-sectional view of a pressure-sensitive acoustic resonator.

FIG. 1B is a schematic plan view of the pressure-sensitive acoustic resonator of FIG. 1A.

FIG. 12 is a flow chart of a process for fabricating a pressure-sensitive acoustic resonator.

Figure 2B:
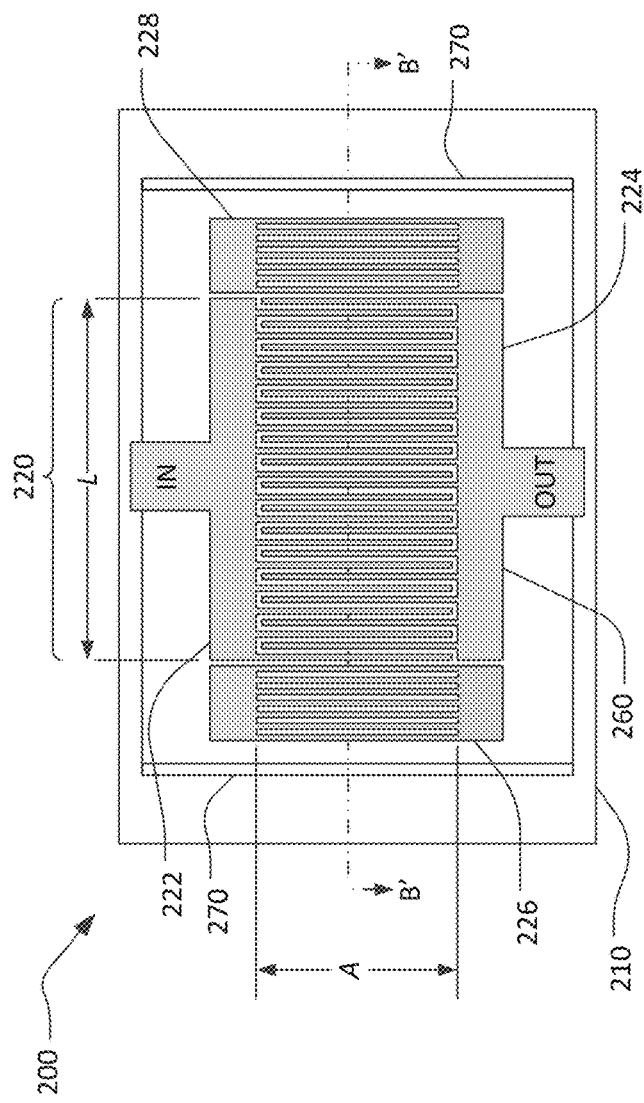
FIG. 2B is a schematic plan view of the pressure-sensitive acoustic resonator of FIG. 2A.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Description of Apparatus

FIG. 1A and FIG. 1B are cross-sectional and plan views, respectively, of a pressure-sensitive acoustic resonator 100. Referring first to FIG. 1A, the pressure-sensitive acoustic resonator 100 includes a nonconductive non-piezoelectric substrate 110. An interdigital conductor pattern (ICP) 120 is disposed on a surface of the substrate 110. The ICP 120, which will be described in further detail subsequently, is a pattern formed in a thin film of conductive material deposited on the surface of the substrate 110. The ICP 120 faces a diaphragm 140, which is a portion of a plate of single-crystal piezoelectric material separated from the substrate 110 by a spacer 130. A front surface 142 of the diaphragm 140 is exposed to an environment through an opening 160. A back surface 144 of the diaphragm 140 faces the ICP 120. A thickness of the spacer 130 is greater than a thickness d of the conductors of the ICP 120 such that the back surface 144 of the diaphragm 140 is separated from the ICP conductors by a gap dimension g. A thickness t of the diaphragm 140 is small compared to the area of the diaphragm, such that the diaphragm 140 will flex, changing the gap dimension g, in response to air pressure 180 applied to the front side 142 of the diaphragm 140.

The substrate 110 may be a plate or wafer of non-piezoelectric dielectric material. For example, the substrate may be fused silica, sapphire, glass, or some other dielectric material. The substrate may be high resistivity silicon. A high resistivity silicon substrate may be coated with a dielectric film such as silicon dioxide, silicon nitride, aluminum oxide, or some other material. A high resistivity silicon substrate may have a trap-rich layer on or in the surface proximate the ICP.

The diaphragm 140 is a single-crystal piezoelectric material such as lithium niobate (LN) or lithium tantalate (LT).

Thin films of LN and LT, suitable for use as the diaphragm 140, are commercially available laminated to a supporting substrate of silicon or some other material. When the supporting substrate is silicon, a silicon dioxide ($SiO_2$) layer may be present between the silicon substrate and the piezoelectric film. To allow the piezoelectric film to function as the diaphragm 140, the supporting substrate 150 and the intermediate $SiO_2$ layer 155, if present, may be etched to form the opening 160. Alternatively, the supporting substrate 150 and the intermediate $SiO_2$ layer 155, if present, may be removed completely (not shown). In either case, a portion of the plate of piezoelectric material outside of a perimeter of the diaphragm 140 is affixed to, and supported by, the spacer 130. The diaphragm 140 (i.e. the portion of the piezoelectric plate within perimeter) is unsupported and free to flex in response to the air pressure 180.

Optionally, one or more pressure relief apertures or holes 145 may be formed through the diaphragm 140. When at least one pressure relief hole 145 is present, the air pressure in the cavity between the diaphragm 140 and the substrate 110 will gradually reach an equilibrium state where the air pressure on the front surface 142 of the diaphragm (i.e. the air pressure 180 external to the pressure-sensitive acoustic resonator 100) and the air pressure on the back surface 144 of the diaphragm are equal. In the equilibrium state, the front surface of the diaphragm 142, the back surface of the diaphragm 144, and the surface 112 of the substrate 100 may be substantially parallel. In this context, "substantially" means "within normal manufacturing tolerances". Depending on the volume of the cavity and the geometry of the pressure relief hole(s), there will be a characteristic relaxation time for the pressure in the cavity to reach the equilibrium state after diaphragm deformation. The inverse of the relaxation time defines a characteristic frequency of the pressure-sensitive acoustic resonator 100. The diaphragm 140 will be relatively unresponsive to pressure variations having frequencies lower than the characteristic frequency. For pressure variations having frequencies significantly higher than the characteristic frequency, the presence of pressure relief holes 145 has little effect, since there is not sufficient time during the pressure cycle for the air pressure in the cavity to equilibrate.

Referring now to FIG. 1B, the ICP 120 (seen through the substrate 110) includes a first plurality of parallel fingers extending from a first busbar 122 and a second plurality of fingers extending from a second busbar 124. The first and second pluralities of parallel fingers are interleaved. Structurally, the ICP is similar to an interdigital transducer (IDT) of a surface acoustic wave resonator. The term "ICP" is used in this patent to distinguish from an IDT because "IDT" is closely associated with SAW devices. The first and second pluralities of parallel fingers overlap for a distance A, commonly referred to as the "aperture" of the ICP. The center-to-center distance L between the outermost fingers of the ICP 120 is the "length" of the ICP. The conductors (i.e. first and second busbars 122, 124 and first and second pluralities of parallel fingers) of the ICP 120 may be made of aluminum, aluminum alloys, copper, copper alloys, gold, molybdenum, tungsten. combinations thereof, or any other suitable conductive material.

Each finger of the first and second pluralities of parallel fingers has a width w. The center-to-center spacing of adjacent parallel fingers is a pitch p. The width w and pitch p are typically, but not necessarily, constant across the length L and aperture A of the ICP 120. As shown in FIG. 1B, w≈p/2. This ratio is exemplary, and w may be from 5% to about 90% of p.

The first and second busbars 122, 124 serve as the terminals of the pressure-sensitive acoustic resonator 100. A radio frequency or microwave signal applied between the two busbars 122, 124 of the ICP 120 creates a spatially varying electric field that extends through the gap into the piezoelectric diaphragm 140. This field excites acoustic waves within the piezoelectric diaphragm 140. Due to strong piezoelectric effect, the acoustic waves in the diaphragm 140 modify the electric fields nearby. This alters the charge on the fingers of the ICP, which is manifested as a change of the ICP admittance. The admittance between the first and second busbars 122, 124 is highly dependent on the coupling between the ICP 120 and acoustic waves in the diaphragm 140, which in turn is dependent on the frequency of the signal applied between the two busbars 122, 124. Typically, the admittance of an acoustic resonator exhibits at least one resonance where the admittance is high, and at least one anti-resonance where the admittance approaches zero. As will be discussed in further detail, the coupling between the ICP 120 and the piezoelectric diaphragm 140 is highly dependent on the spacing (i.e. gap dimension g) between the ICP and the diaphragm. The frequencies of the resonance and anti-resonance are also dependent on gap dimension g.

Acoustic Bragg reflectors 126 and 128 may be disposed at the ends of the ICP 120 to confine acoustic waves to the portion of the diaphragm 140 facing the ICP 120. When present, each acoustic Bragg reflector 126, 128 will include a plurality of parallel conductive fingers. The width and pitch of the conductive fingers of the acoustic Bragg reflectors may be the same as, or different from, the width w and pitch p of the interleaved fingers of the ICP 120.

For ease of presentation in FIG. 1A and FIG. 1B, the geometric pitch (dimension p) and width (dimension w) of the ICP fingers is greatly exaggerated with respect to the length (dimension L) and aperture (dimension A) of the ICP 120. A typical ICP has more than the thirty-two parallel fingers shown in the ICP 120. An ICP may have hundreds of parallel fingers. Similarly, the acoustic Bragg reflectors may have more than seven parallel fingers. In addition, the thickness of the fingers (dimension d) and the gap (dimension g) in the cross-sectional view FIG. 1A is greatly exaggerated relative to the width and pitch of the ICP fingers. Because the ICP conductors are not subject to significant acoustic vibration (which is concentrated in the diaphragm 140), the thickness d of the ICP fingers may be comparable to the gap g.

In FIG. 1B, the opening has a rectangular shape. The opening of a pressure-sensitive acoustic resonator need not be rectangular and may be some other shape such as a circle, an ellipse, or a regular or irregular polygon. Additionally, in FIG. 1B, the ICP 120 is shown centered on the opening 160. The ICP of a pressure-sensitive acoustic resonator need not be centered on the opening but may be offset from the center of the opening in any direction. Further, in FIG. 1B, an area of the ICP 120 is roughly 50% of an area of the opening 160. The ICP of a pressure-sensitive acoustic resonator may have an area greater than 50% of the area of the opening and may commonly have an area less that 50% of the area of the opening.

For a circular isotropic diaphragm of radius R and thickness t, constrained about its entire perimeter, the deflection in the middle of the diaphragm is determined by formula:

$$\frac{\Delta t}{t} = \frac{3 \cdot P \cdot (1 - \sigma^2)}{16 \cdot \left(\frac{t}{R}\right)^4 \cdot E} \qquad 0001$$

Wherein σ is Poisson's coefficient and E is Young's elastic modulus of the diaphragm material. Characteristic values of Young's modulus for hard solids are about $2*10^{11}$ Pa. Peak deflection comparable with the thickness can be achieved when t/R is of the order of $10^{-3}$, which is to say when the radius of the diaphragm must be about 1000 times larger than its thickness.

Thin films of LN and LT are commercially available laminated to a supporting substrate of silicon or some other material. The thickness of these films may be selected in a range from 300 nm to over 1000 nm. For an 800 um diameter circular diaphragm diameter made of a 400 nm thick LN film, formula (1) indicates about 300 nm deflection in the center of the diaphragm for a pressure of 1 Pa, which is a typical pressure for normal speech.

Figure 2A:
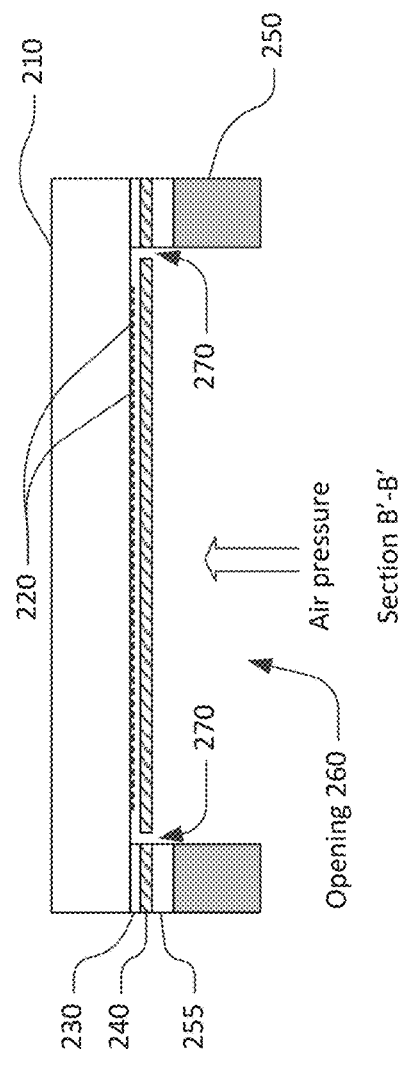
FIG. 2A is schematic cross-sectional view of another pressure-sensitive acoustic resonator.

FIG. 2A and FIG. 2B are cross-sectional and plan views, respectively, of another pressure-sensitive acoustic resonator 200. The architecture and elements of the pressure-sensitive acoustic resonator 200 are similar or identical to the corresponding elements of the pressure-sensitive acoustic resonator 100 of FIG. 1A and FIG. 1B. Descriptions of identical elements will not be repeated.

The primary difference between the pressure-sensitive acoustic resonator 200 and the pressure-sensitive acoustic resonator 100 are slots 270 formed along two opposing sides (the left and right sides as shown in FIG. 2B) of the diaphragm 240. These slots pass through the diaphragm such that the diaphragm adjacent to the slots is free to flex and only the other two sides (the top and bottom sides as shown in FIG. 2B) are attached to the spacer 230 and thus maintained in fixed positions relative to the substrate 210.

Figure 3B:
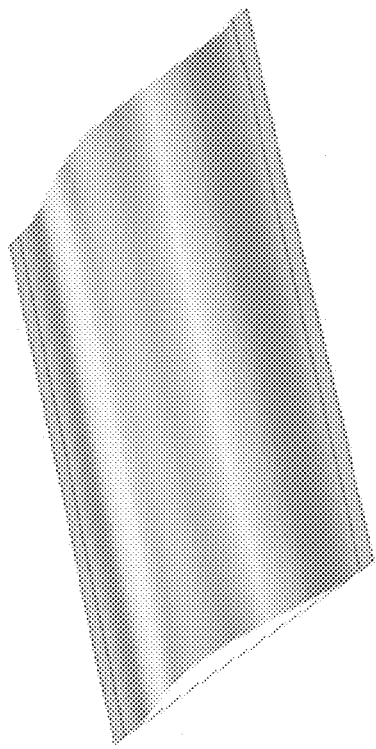
FIG. 3B is a representation of a deformed square diaphragm with two opposing edges held in fixed positions.
Figure 3A:
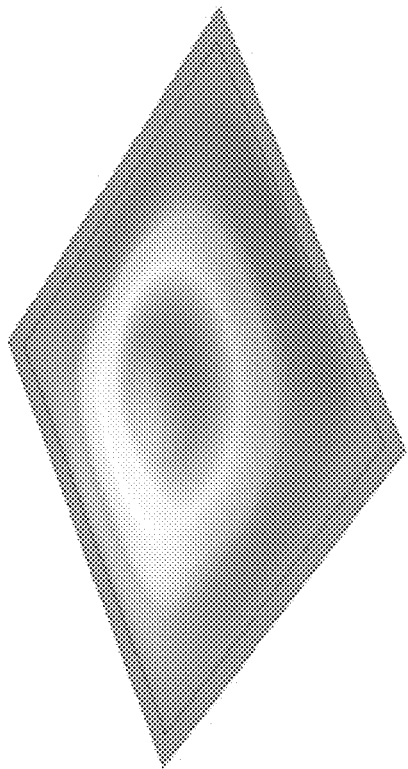
FIG. 3A is a representation of a deformed square diaphragm with all four edges held in fixed positions.

The effect of freeing two opposing edges of the diaphragm can be understood by comparing FIG. 3A and FIG. 3B. FIG. 3A shows the simulated deflection of a square diaphragm with all four edges constrained or held in a fixed plane. FIG. 3B shows the simulated deflection of the same square diaphragm under the same pressure, but with only two opposing edges constrained or held in a fixed plane. In both cases, the diaphragm dimensions are 1 mm×1 mm×1 um thick. In FIG. 3A, an area of high deflection is confined to the center of the diaphragm. The deflection is approximately proportional to the applied air pressure, with a maximum deflection of 74 nm at a pressure of 1 Pascal (Pa). The deflection of the diaphragm in FIG. 3B is relatively uniform along a direction parallel to the constrained edges. The deflection is again approximately proportional to the applied air pressure, with a maximum deflection of 146 nm at a pressure of 1 Pascal (Pa).

An effect of freeing two edges of the diaphragm is that the slots (i.e. slots 270 in FIGS. 2A and 2B) required to free the edges will function as pressure relief apertures. The large area (for example, compared to the single hole 145 shown in FIG. 1B) of the slots will allow relatively fast equilibration and a correspondingly high characteristic frequency.

Example 1

Figure 4:
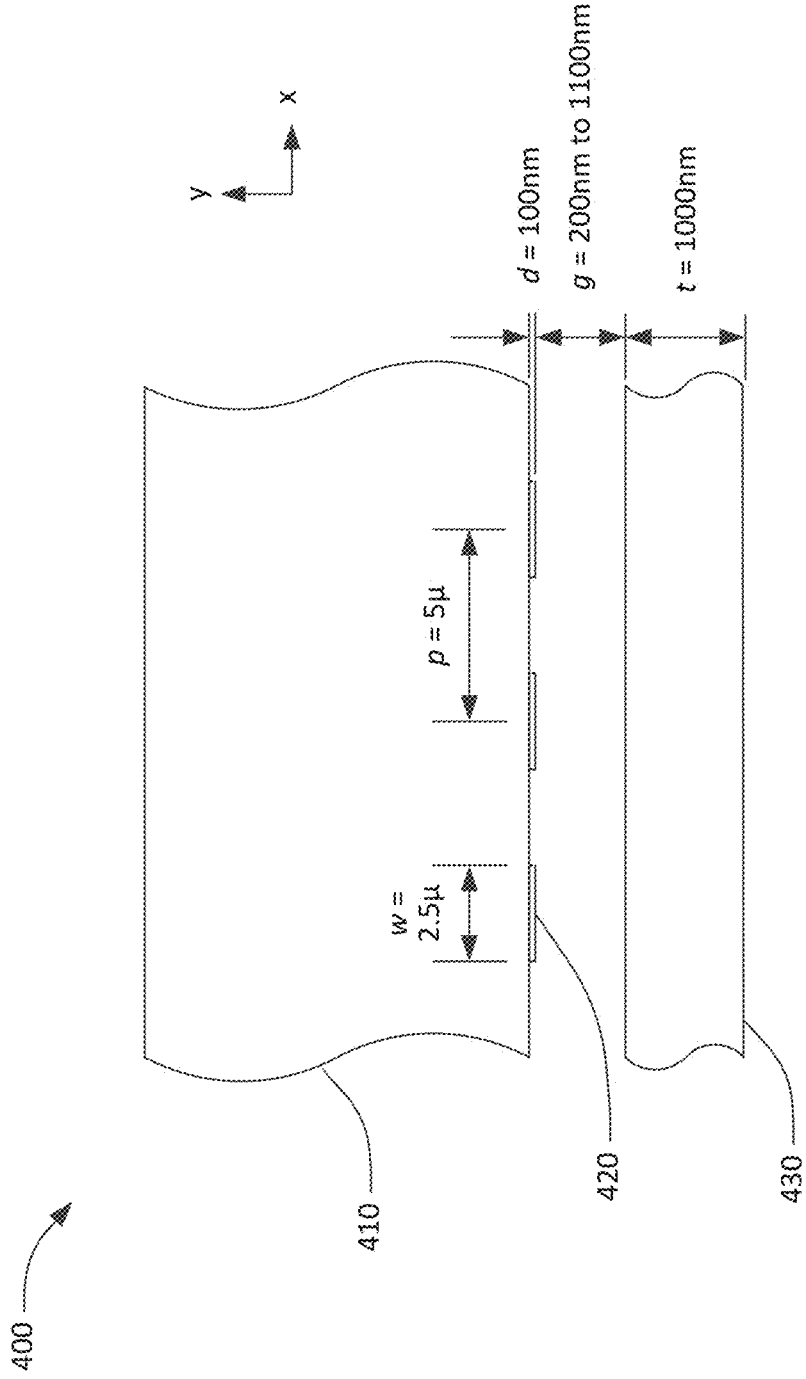
FIG. 4 is a schematic cross-sectional view of a portion of a first example of a pressure-sensitive acoustic resonator.

FIG. 4 is a cross-sectional view of a portion of an exemplary pressure-sensitive acoustic resonator 400. The pressure-sensitive acoustic resonator 400 includes a substrate 410, an ICP 420 formed on the substrate 410, and a diaphragm 430. In this example, the pitch p, width w and thickness d of the aluminum ICP electrodes 420 are 10 um, 5 um, and 100 nm, respectively. Other embodiments may use different dimensions. The ratio of the finger width w to the finger pitch p may be between 0.3 and 0.7. In this example, the ICP has a total of 100 electrode fingers, with 50 additional fingers forming Bragg reflectors at each end of the ICP. In this example, the diaphragm 430 is YX cut LN, which is to say the Y crystalline axis is normal to the front and back surfaces of the diaphragm and a shear wave with the main displacement parallel to the crystalline axis z propagates in x-direction. This is the SH0 acoustic mode with more or less uniform displacement aperture across the membrane/diaphragm thickness. The waves are excited mainly by Ex component of the electric fields produced by the electrode system due to strong piezo module $e_{16}$ of LN. The thickness t of the diaphragm 430 may be from about 400 nm to about 1000 nm. In the example of FIG. 4, the thickness t of the diaphragm 430 is 1000 nm. In other embodiments, the diaphragm may be a rotated Y-cut with Euler angles of [0°, β=60° to 180°, 0°], with very high coupling for 112°≤β≤128°, and maximum coupling achieved at β=120° (commonly called a "30° YX-cut"). The fingers of the ICP are parallel to the z axis of the diaphragm 430. A microwave signal applied to the ICP excites quasi-shear waves in the diaphragm 430 such that the acoustic energy flow is along the X axis. The performance of the exemplary pressure-sensitive acoustic resonator 400 has been simulated for gap dimension g from 200 to 1100 nm.

Figure 5:
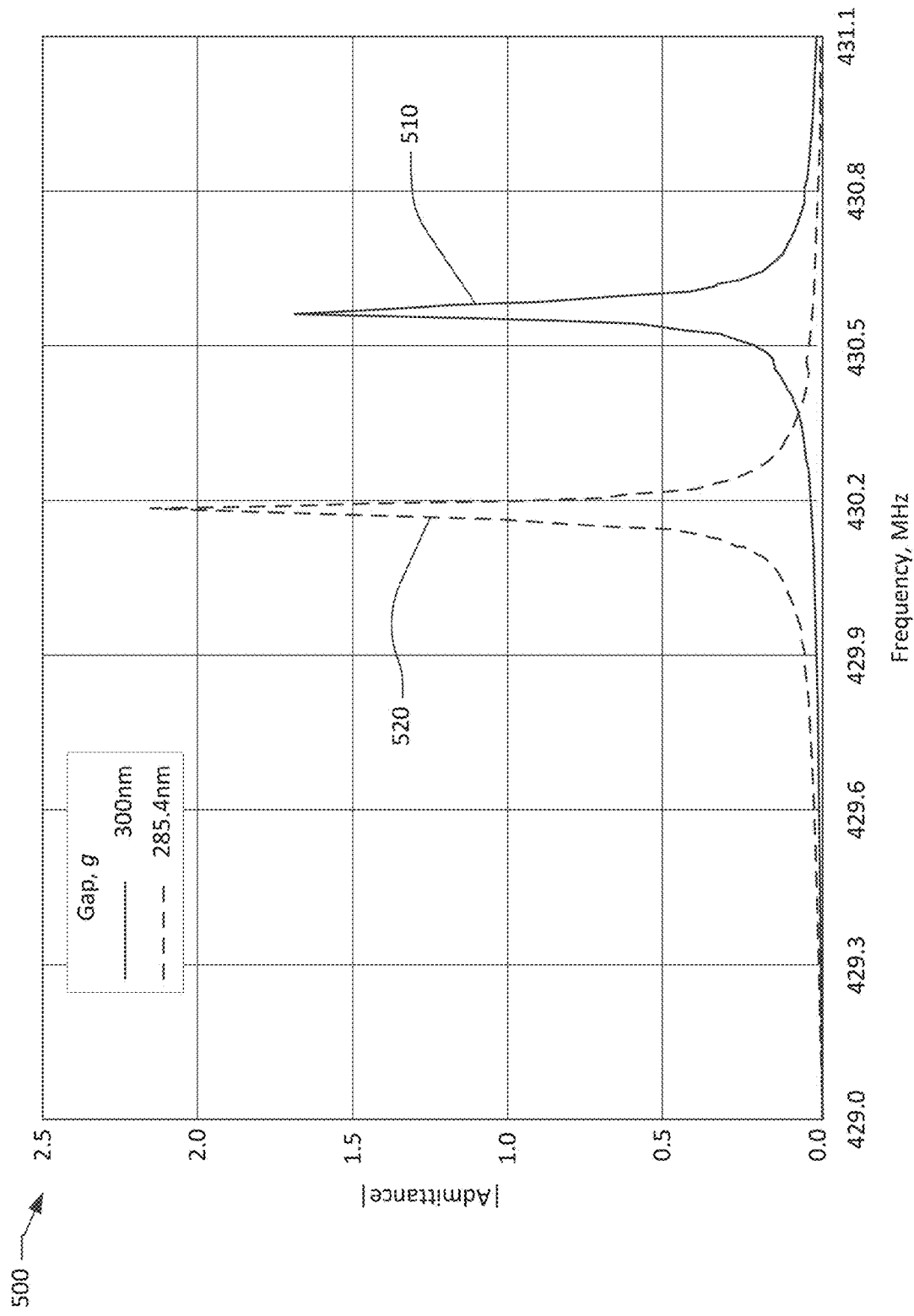
FIG. 5 is a chart of the absolute value of the admittance of the pressure-sensitive acoustic resonator of FIG. 4 for two different positions of a piezoelectric diaphragm.

FIG. 5 is graph 500 showing results from simulating the performance of the pressure sensitive acoustic resonator 400 of FIG. 4. The solid line 510 is a plot of the admittance (between the busbars of the ICP) as a function of frequency with the gap dimension g equal to 300 nm. The dashed line 520 is a plot of the admittance with the gap dimension g equal to 285.4 nm, which is 300 nm less 14.6 nm, which is representative of the deflection of the diaphragm of FIG. 3B under a pressure of 0.1 PA. Note, however, the simulation results in FIG. 5 and FIG. 6 assume the diaphragm 430 remains parallel to the substrate 410. Comparison of the solid and dashed plots 510, 520 shows that changing the gap dimension by 14.6 nm results in a 380 kHz shift in the resonant frequency of the pressure sensitive acoustic resonator.

Figure 6:
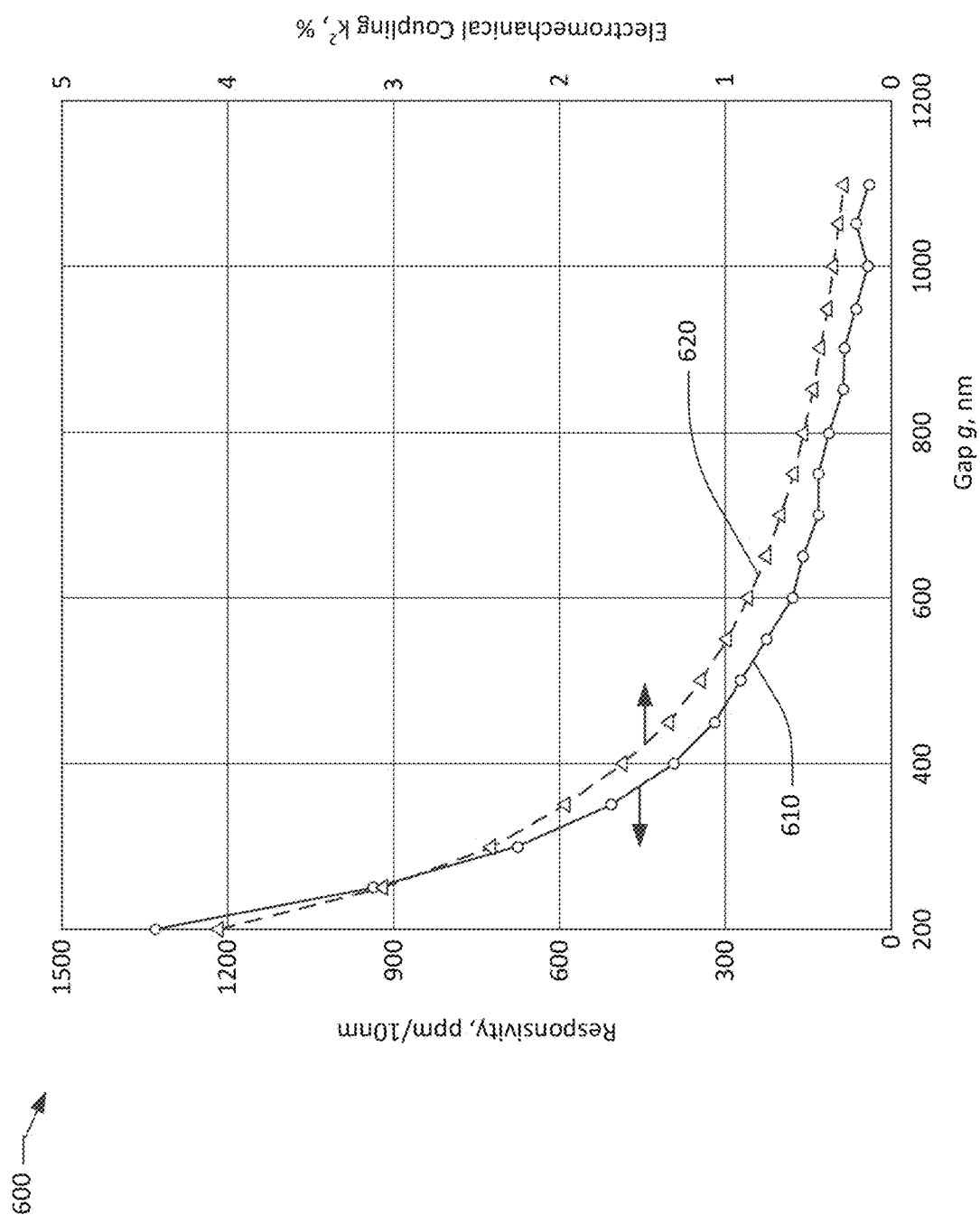
FIG. 6 is a chart of the responsivity and electromechanical coupling of the pressure-sensitive acoustic resonator of FIG. 4 as a function of the position of the piezoelectric diaphragm.

FIG. 6 is graph 600 showing additional results from simulating the performance of the pressure sensitive acoustic resonator 400 of FIG. 4. The solid line 610 is a plot of the responsivity (frequency change in parts per million per 10 nm change in the gap dimension g) of the pressure sensitive acoustic resonator 400 as a function of the gap dimension g. The dashed line 620 is a plot of the electromechanical coupling coefficient of the pressure sensitive acoustic resonator 400 as a function of the gap dimension g.

Example 2

Figure 7:
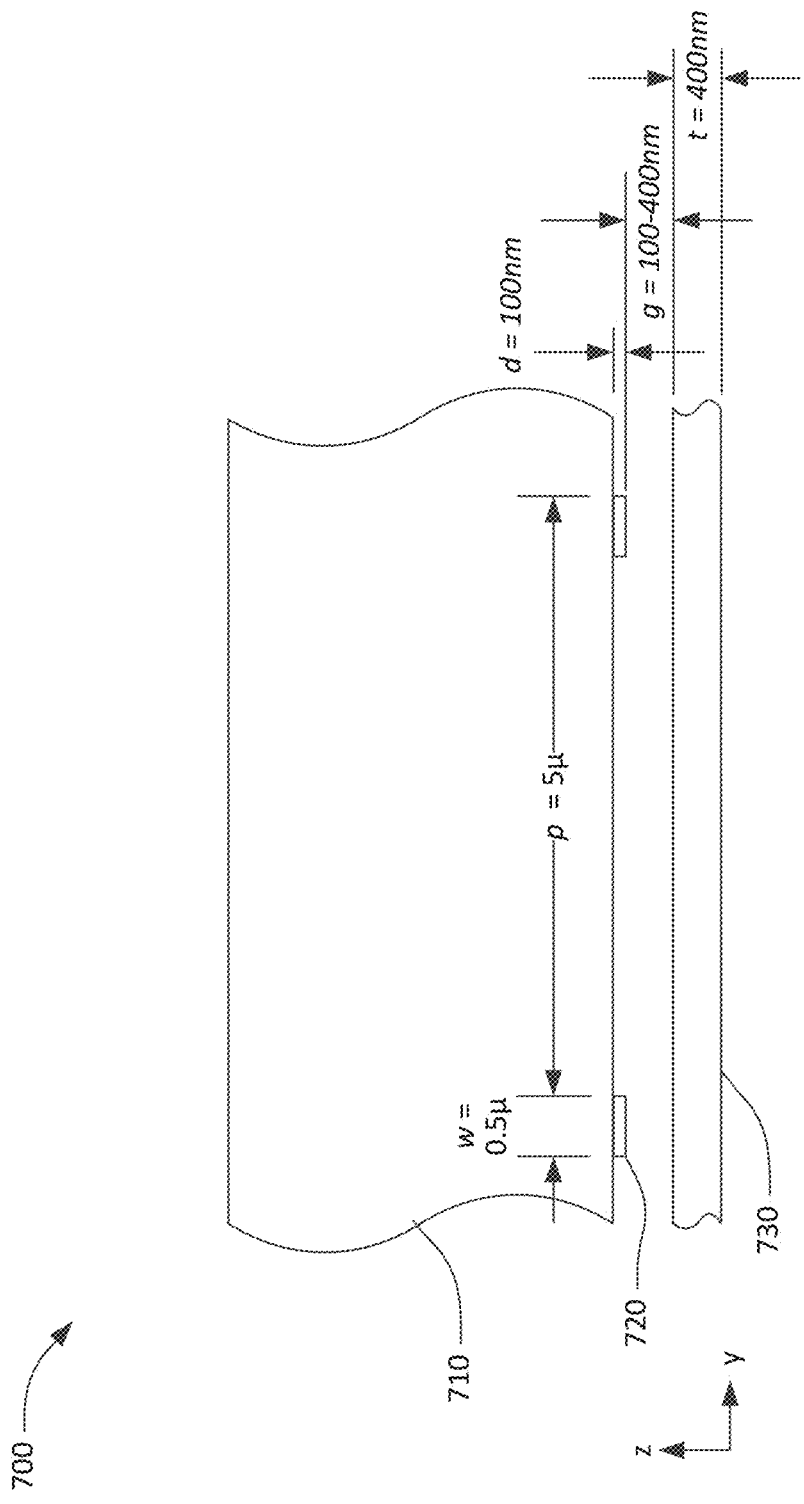
FIG. 7 is a schematic cross-sectional view of a portion of a second example of a pressure-sensitive acoustic resonator.

FIG. 7 is a cross-sectional view of a portion of an exemplary pressure-sensitive acoustic resonator 700. The pressure-sensitive acoustic resonator 700 includes a substrate 710, an ICP 720 formed on the substrate, and a diaphragm 730. In this example, the pitch p, width w and thickness d of the aluminum ICP electrodes 720 are 5 um, 0.5 um, and 100 nm, respectively. Other embodiments may have different dimensions. The ratio of the finger width w to the finger pitch p may be less than 0.5.

In this example, the diaphragm 730 is ZY cut LN. The diaphragm may also be rotated Y-cut LN with Euler angles [0°, −15° to 0°, 90°] or LN with Euler angles [0°, 100° to 150°, 0°]. For example, a rotated Y-cut LN with Euler angles [0°, −7.5°, 90°] provides higher coupling than a ZY cut diaphragm. The thickness t of the diaphragm may be from about 300 nm to about 500 nm. In the example of FIG. 7, the diaphragm 730 has a thickness t of 400 nm. This structure is similar to a transversely excited film bulk wave resonator as described in co-pending application Ser. No. 16/203,443. The ratio of the finger width w to the finger pitch p may be, typically, between 0.05 and 0.25. A microwave signal applied to the ICP creates quasi-electrostatic electric field between the electrodes penetrating into the diaphragm and, due to strong piezo-coupling, (module $e_{24}$), excites shear waves in the diaphragm 730. While the atomic motions are predominantly parallel to the Y axis (i.e. horizontal as shown in FIG. 7), the predominant direction of propagation of the excited shear acoustic waves is alternately up and down (in Z-direction, as shown in FIG. 7), normal to the surfaces of the diaphragm, creating a standing wave due to complete reflection at the front and back surfaces of the diaphragm The performance of the exemplary pressure-sensitive acoustic resonator 700 has been simulated for gap dimension g from 100 to 400 nm. Note, however, the simulation results in FIG. 8 and FIG. 9 assume the diaphragm 730 remains parallel to the substrate 710.

Figure 8:
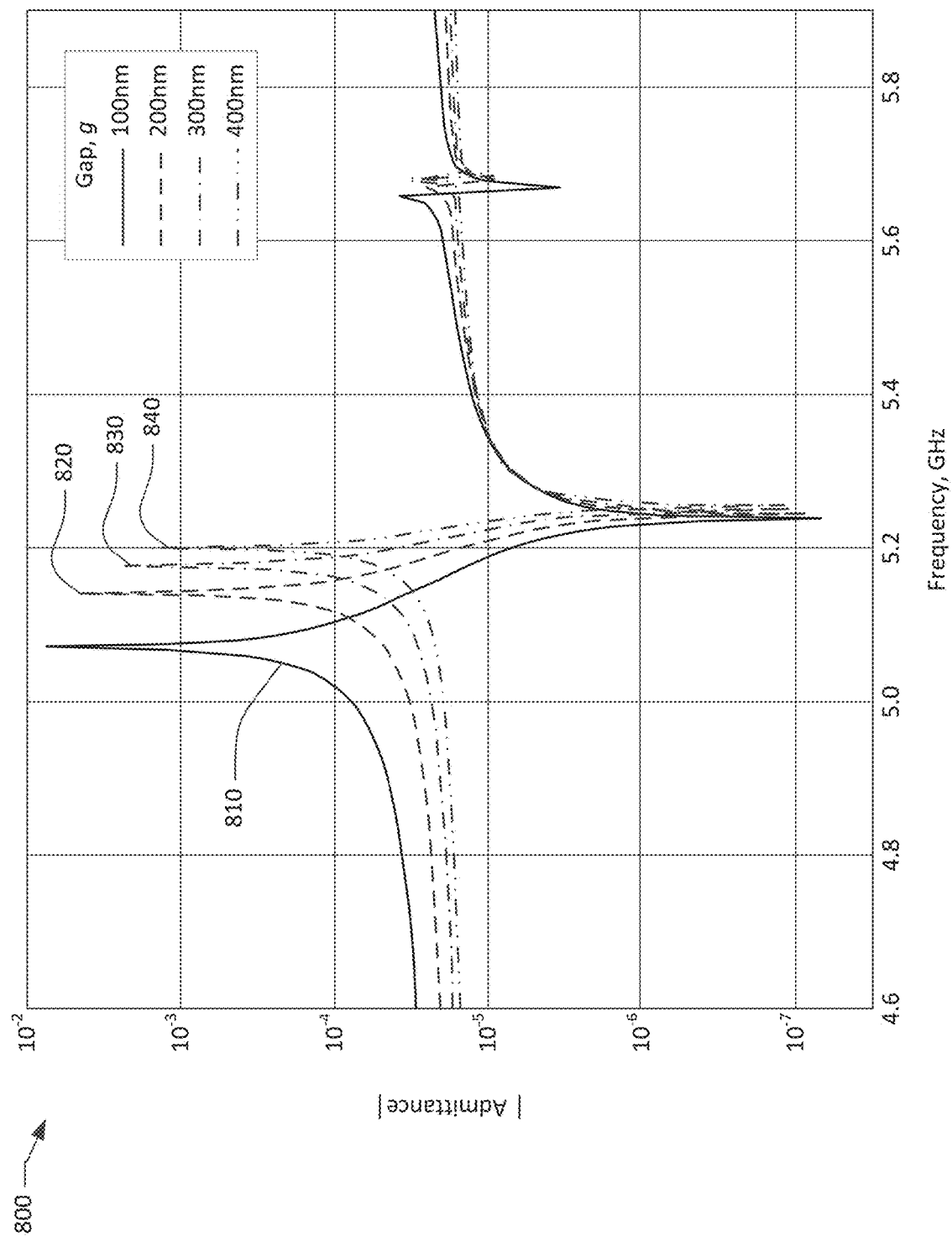
FIG. 8 is a chart of the admittance of the pressure-sensitive acoustic resonator of FIG. 7 for four different positions of a piezoelectric diaphragm.

FIG. 8 is graph 800 showing results from simulating the performance of the pressure sensitive acoustic resonator 700 of FIG. 7. The solid line 810 is a plot of the admittance (between the busbars of the ICP) as a function of frequency with the gap dimension g equal to 100 nm. The dashed line 820 is a plot of the admittance with the gap dimension g equal to 200 nm. The dash-dot line 830 is a plot of the admittance with the gap dimension g equal to 300 nm. The dash-dot-dot line 840 is a plot of the admittance with the gap dimension g equal to 400 nm. Comparison of the four plots 810, 820, 830, 840 shows that reducing the gap dimension from 400 nm to 100 nm results in a decrease in the resonance frequency while the anti-resonance frequency decreases by a substantially smaller amount. The increase in the difference between the resonance and anti-resonance frequencies is indicative of an increase in the electromechanical coupling coefficient of the pressure sensitive acoustic resonator as the gap dimension g is reduced.

Figure 9:
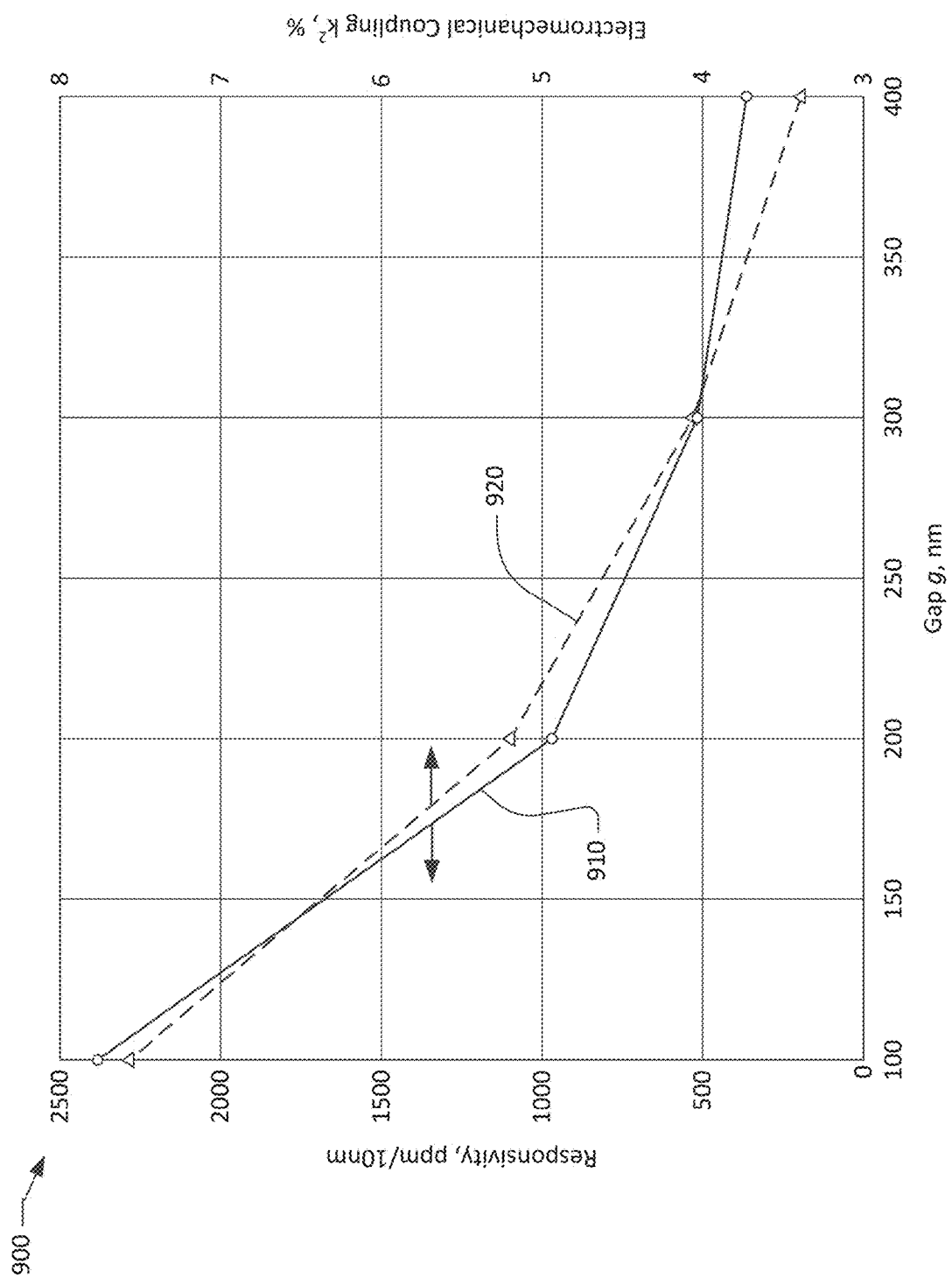
FIG. 9 is a chart of the responsivity and electromechanical coupling of the pressure-sensitive acoustic resonator of FIG. 7 as a function of the position of the piezoelectric diaphragm.

FIG. 9 is graph 900 showing additional results from simulating the performance of the pressure sensitive acoustic resonator 700 of FIG. 7. The solid line 910 is a plot of the responsivity (frequency change in parts per million per 10 nm change in the gap dimension g) of the pressure sensitive acoustic resonator 700 as a function of the gap dimension g. The dashed line 920 is a plot of the electromechanical coupling coefficient of the pressure sensitive acoustic resonator 700 as a function of the gap dimension g.

Example 3

Figure 10:
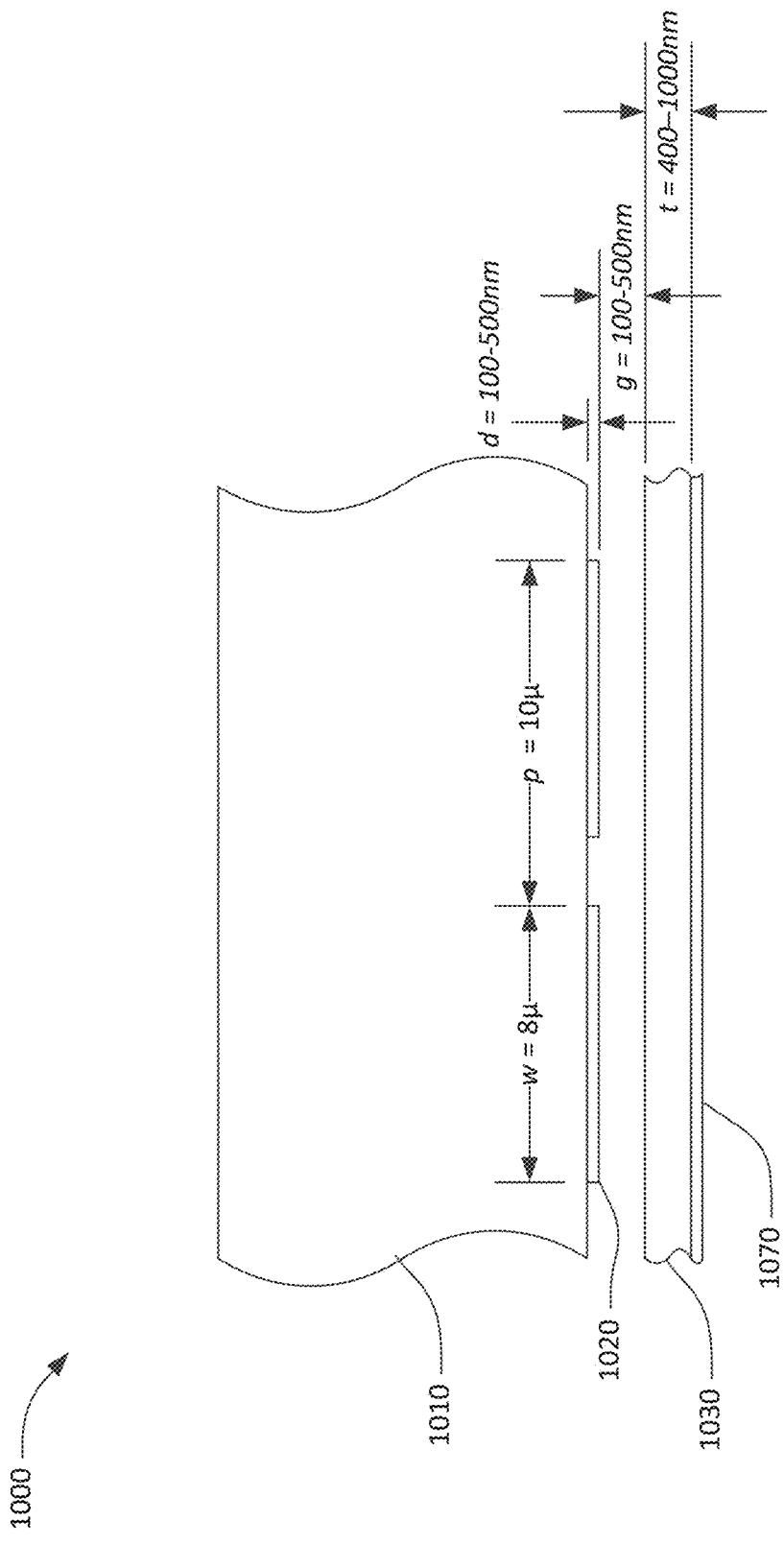
FIG. 10 is a schematic cross-sectional view of a portion of a third example of a pressure-sensitive acoustic resonator.

FIG. 10 is a cross-sectional view of a portion of a third exemplary pressure-sensitive acoustic resonator 1000. The pressure-sensitive acoustic resonator 1000 includes a substrate 1010, an ICP 1020 formed on the substrate 1010, a diaphragm 1030 and a floating conductor 1070 on the front surface of the diaphragm 1030. The ratio of the finger width w to the finger pitch p of the ICP may be between 0.7 and 0.95. In this example, the pitch p, width w and thickness d of the aluminum ICP electrodes 720 are 10 um, 8 um, and 100-500 nm, respectively. The gap g between the ICP 1020 and the diaphragm 1030 may be, for example, 100 nm to 500 nm.

The material and thickness of the ICP 1020 and floating conductor 1070 may be the same or different from the ICP 1020. The material may be aluminum, molybdenum, tungsten, of other metal with low acoustic loss.

The diaphragm 1030 lithium niobate with a thickness t of 400 nm to 1000 nm. The diaphragm may be XY-cut LN, YX-cut LN, or rotated YX cut LN with Euler angles [0°, 70° to 100°, 0°]. In the example of FIG. 10, the X crystalline axis is normal to the front and back surfaces of the diaphragm. The electrodes are parallel to z-axis.

The exemplary pressure-sensitive acoustic resonator 1000 is electrically similar to two film bulk acoustic resonators (FBARs) connected in series. When microwave signal is applied to the ICP 1020, the floating conductor 1070 assumes a potential half way between the potentials applied to the ICP. The resulting electric field is normal to the surfaces of the diaphragm 1030 over most of the area of each ICP finger. This electric field excites shear acoustic waves in the diaphragm 1030 such that the acoustic energy flow in along the X axis, normal to the surfaces of the diaphragm. As in the previous examples, the resonance frequency of the resonator is determined, in part, by the gap distance g. The sensitivity of the resonance frequency to vertical displacement of the diaphragm 1030 is comparable to the sensitively of Example 2.

Figure 11:
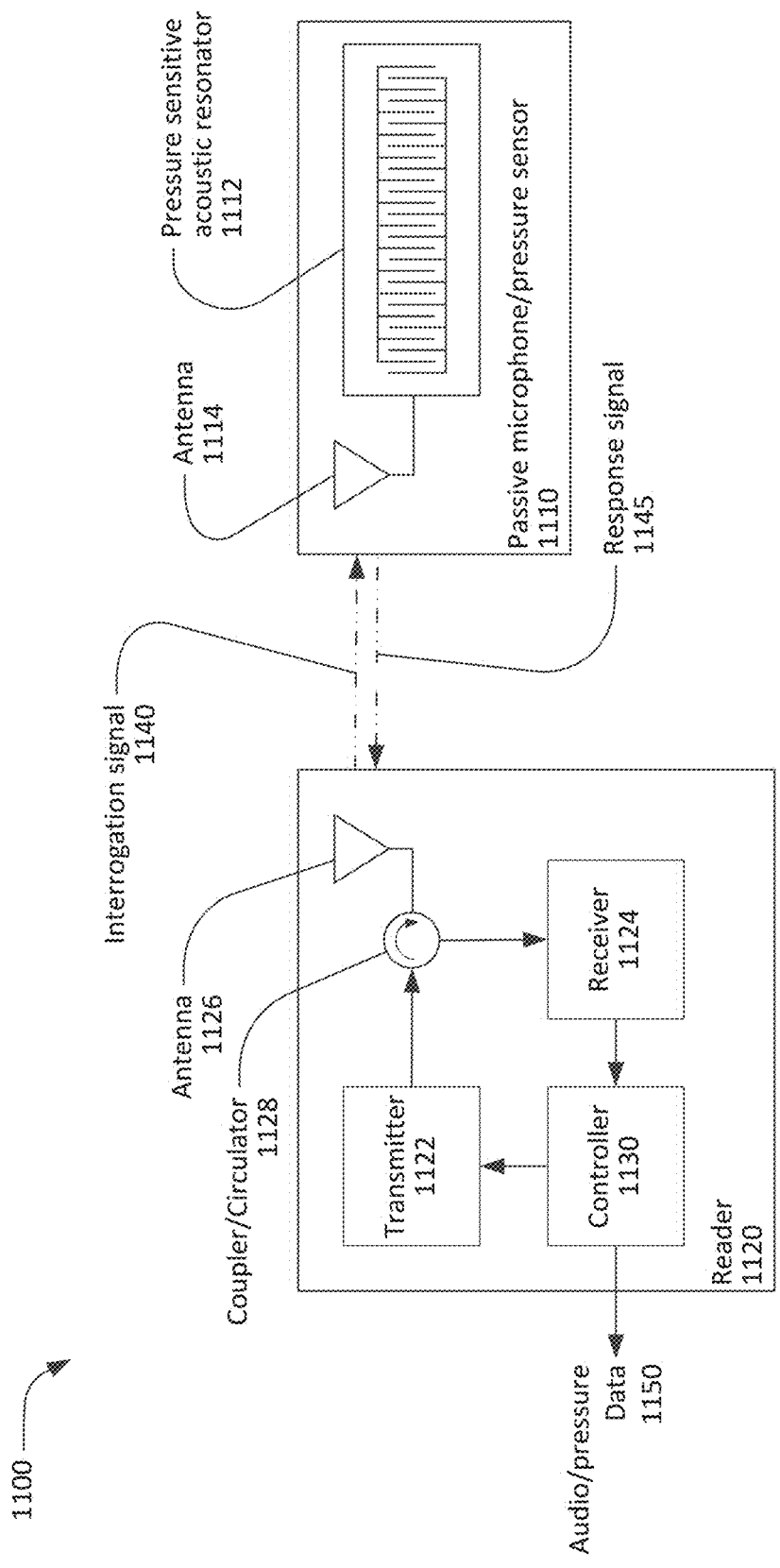
FIG. 11 is a block diagram of a remote pressure sensing system using a pressure-sensitive acoustic resonator.

FIG. 11 is a block diagram of a remote pressure sensing system 1100 including a remotely interrogatable passive microphone/pressure sensor 1110 and a reader 1120 to interrogate the passive microphone 1110 using an RF signal. The remote pressure sensing system 1100 may be used in a variety of situations where direct physical measurements are not possible or practical. For example, the remote pressure sensing system 1100 may be used to conduct covert surveillance or to measure phenomenon in hazardous or otherwise inaccessible environments.

The remotely interrogatable passive microphone/pressure sensor 1110 includes a pressure sensitive acoustic resonator 1112, which may be the pressure sensitive acoustic resonator 100, 200, 400, 700, or 1000 coupled to an antenna 1114. As previously described, the pressure sensitive acoustic resonator 1112 includes a nonconductive non-piezoelectric substrate, an ICP formed on a surface of the substrate, and a piezoelectric diaphragm facing the ICP. A gap between the piezoelectric diaphragm and the ICP is influenced by external air or acoustic pressure on the diaphragm. The antenna 1114 may be any antenna suitable for use at frequencies near the resonance frequency of the pressure sensitive acoustic resonator 1112. Preferably, the antenna 1114 may be a printed antenna formed on the same surface of the substrate as the ICP. For example, the antenna 1114 may be a printed dipole or tapered slot antenna. The antenna may be formed in the same conductive layer as the ICP using the same processes used to form the ICP.

The reader 1120 is configured to remotely interrogate the passive microphone/pressure sensor 1110 to read pressure variations and/or acoustic vibrations sensed by the pressure sensitive acoustic resonator 1112. To this end, the reader transmits an interrogating signal 1140. The interrogating signal 1140 is received by the antenna 1114 within the passive microphone/pressure sensor 1110. At least a portion of the interrogating signal 1140 is reflected by the pressure sensitive acoustic resonator 1112 to form a response signal 1145 that is transmitted through the antenna 1114. The response signal contains information about variations in the gap within the passive microphone/pressure sensor 1110. The response signal 1145 is received and processed by the reader 1120 to extract the information about the gap distance and convert this information to audio/pressure data 1150.

The reader 1120 includes a transmitter 1122 to generate the interrogation signal 1140, a receiver 1124 to receive the response signal 1145, and at least one antenna 1126. The reader 1120 may include a directional coupler or circulator 1128 to couple the interrogation signal 1140 from the transmitter 1122 to the antenna 1126 and to couple the response signal 1145 from the antenna 1126 to the receiver 1124. In some situations, separate antennas (not shown) may be provided for transmission and reception, in which case the coupler/circulator 1128 may not be present.

The reader 1120 also includes a controller 1130 to control the operation of the transmitter 1122 and to process the received response signal 1145 to extract the audio/pressure data 1150. The controller 1130 may include one or more processors such as a microprocessor, a graphics processing unit, and/or a digital signal processor. The controller 1130 may include volatile and nonvolatile memory and may store software instructions to cause the controller to perform its function. The controller 1130 may have an interface to a network (not shown). The controller 1130 may have a user interface (not shown) that may include a display and one or more user input devices. The controller 1130 may communicate with the transmitter 1122 and the receiver 1124 by means of, for example, a bus, a network or dedicated connections.

A variety of schemes may be used to interrogate the passive microphone/pressure sensor 1110. For example, the interrogation signal 1140 may be a continuous or pulsed signal having a fixed frequency near to the resonance frequency of the pressure sensitive acoustic resonator 1112. In this case the reader may extract audio/pressure data 1150 based on the amplitude and/or phase of the response signal returned from the passive microphone/pressure sensor 1110. Alternatively, the interrogation signal 1140 may be a broadband or swept signal and the reader may extract audio/pressure data 1150 based on the frequency spectrum of the response signal returned from the passive microphone/pressure sensor 1110. Other interrogation signals and extraction techniques may be used.

Description of Methods

FIG. 12 is a simplified flow chart of a method 1200 for making a pressure-sensitive resonator, such as the pressure sensitive resonators 100, 200, 400, and 700, or a passive microphone/pressure sensor such as the passive microphone/pressure sensor 1110. The method 1200 starts at 1210 with a thin piezoelectric plate 140 disposed on a nonconductive non-piezoelectric substrate 150 and a nonconductive non-piezoelectric substrate 110. The method 1210 ends at 1290 with a completed pressure-sensitive resonator or a passive microphone/pressure sensor. The flow chart of FIG. 12 includes only major process steps. Various conventional process steps (e.g. surface preparation, cleaning, inspection, baking, annealing, monitoring, testing, etc.) may be performed before, between, after, and during the steps shown in FIG. 12.

Thin plates of a single-crystal piezoelectric materials (such as the plate 140) bonded to a non-piezoelectric substrate (such as the substrate 150) are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1200 nm. When the substrate 150 is silicon, a layer of $SiO_2$ may be disposed between the piezoelectric plate and the substrate. The piezoelectric plate 140 may be, for example, y-cut lithium niobate with a thickness of 1000 nm or z-cut lithium niobate with a thickness of 400 nm (as used in the previous examples) bonded to a silicon wafer 150 with an intervening $SiO_2$ layer 155. The substrate 110 may be silicon fused silica, quartz, or some other material.

At 1220, a conductor pattern including an ICP 120 is formed on a surface of the substrate 110 by depositing and patterning one or more conductor layers. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the substrate 110. A conduction enhancement layer of gold, aluminum, copper or other higher conductivity metal may be formed over portions of the conductor pattern. When the device being fabricated is a passive microphone/pressure sensor, the conductor pattern may include a planar antenna such as a dipole antenna or a tapered slot antenna.

The conductor pattern may be formed at 1220 by depositing the conductor layer and, optionally, one or more other metal layers in sequence over the surface of the substrate 110. The excess metal may then be removed by etching through patterned photoresist. The conductor layer can be etched, for example, by plasma etching, reactive ion etching, wet chemical etching, and other etching techniques.

Alternatively, the conductor pattern may be formed at 1220 using a lift-off process. Photoresist may be deposited over the substrate 110 and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1230, a spacer 130 may be formed on the surface of the substrate 110 by depositing and patterning a dielectric layer such as $SiO_2$. A thickness of the spacer 130 may be 100 to 1200 nm greater than a thickness of the conductor pattern formed at 1220.

At 1240, the piezoelectric plate 140 (which is still bonded to the non-piezoelectric substrate 150) is bonded to the spacer 130. The piezoelectric plate 140 and the spacer 130 may be bonded using a wafer bonding process such as direct bonding, surface-activated or plasma-activated bonding, electrostatic bonding, or some other bonding technique.

At 1250, after the piezoelectric plate 140 on the non-piezoelectric substrate 150 and the spacer 130 are bonded, the non-piezoelectric substrate 150 and any intervening layers 155, are removed to leave a portion of the piezoelectric plate 140 suspended over the ICP 120. The non-piezoelectric substrate 150 and any intervening layers 155 may be completely removed or may be removed only over a portion of the piezoelectric plate 140 that will function as the diaphragm of the pressure-sensitive resonator. The non-piezoelectric substrate 150 and any intervening layers 155 may be removed, for example, by material-dependent wet or dry etching or some other process. At 1250, one or more pressure relief holes 145 or slots (270 in FIG. 2A) may be etched through the diaphragm if required.

The pressure-sensitive resonator device or passive microphone/pressure sensor device may then be completed at 1260. Actions that may occur at 1260 including depositing and patterning additional metal layers to form conductors other than the ICP conductor pattern; depositing and patterning the front side electrode (i.e. 1070 in FIG. 10), depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices;

other packaging steps; and testing. After device is completed, the process ends at 1290.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined, further refined, and/o performed in different order to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A pressure-sensitive acoustic resonator, comprising:
   a conductor pattern on a planar surface of a non-piezoelectric substrate, the conductor pattern including an interdigital conductor pattern (ICP); and
   a piezoelectric diaphragm having a front surface exposed to an environment and a back surface facing, but not contacting, the ICP, such that the back surface of the piezoelectric diaphragm is separated from the ICP by a gap,
   wherein the piezoelectric diaphragm does not include a conductor pattern directly disposed on either the front surface or the back surface thereof,
   wherein the conductor pattern comprises a single set of interleaved fingers on one surface of the non-piezoelectric substrate, and
   wherein the acoustic resonator is configured as a film bulk acoustic resonator.

2. The pressure-sensitive acoustic resonator of claim 1, wherein a resonance frequency of the pressure-sensitive acoustic resonator is based at least in part on a distance between the back surface of the piezoelectric diaphragm and the planar surface of the substrate.

3. The pressure-sensitive acoustic resonator of claim 2, wherein the back surface of the piezoelectric diaphragm is configured to move relative to the planar surface of the substrate in response to a change in an air pressure on the front surface of the piezoelectric diaphragm, resulting in a corresponding change in the resonance frequency of the pressure-sensitive acoustic resonator.

4. The pressure-sensitive acoustic resonator of claim 1, wherein, in an equilibrium state where air pressures on the front and back surfaces of the piezoelectric diaphragm are equal:
   the front surface of the piezoelectric diaphragm, the back surface of the piezoelectric diaphragm and the planar surface of the substrate are substantially parallel, and
   the back surface of the piezoelectric diaphragm is separated from the planar surface of the substrate by an equilibrium distance.

5. The pressure-sensitive acoustic resonator of claim 4, further comprising:
   a piezoelectric plate that includes a portion forming the piezoelectric diaphragm;
   a spacer that connects the substrate to the piezoelectric plate outside of at least a portion of a perimeter of the piezoelectric diaphragm,
   wherein a thickness of the spacer determines the equilibrium distance between the back surface of the piezoelectric diaphragm and the planar surface of the substrate.

6. The pressure-sensitive acoustic resonator of claim 5, wherein the spacer connects the substrate to the piezoelectric plate outside of all of the perimeter of the piezoelectric diaphragm.

7. The pressure-sensitive acoustic resonator of claim 6, further comprising one or more pressure relief holes extending through the piezoelectric diaphragm.

8. The pressure-sensitive acoustic resonator of claim 5, wherein the perimeter of the piezoelectric diaphragm has a rectangular shape, and the spacer connects the substrate to the piezoelectric plate along two opposing sides of the piezoelectric diaphragm.

9. The pressure-sensitive acoustic resonator of claim 1, wherein the conductor pattern further includes a planar antenna connected to the ICP.

10. The pressure-sensitive acoustic resonator of claim 9, wherein the planar antenna is one of a dipole antenna, a tapered slot antenna, a loop antenna, and a patch antenna.

11. The pressure sensitive acoustic resonator of claim 1, wherein:
    the piezoelectric diaphragm is YX cut lithium niobate, having a crystalline Y axis normal to the front and back surfaces of the piezoelectric diaphragm, and
    the ICP is configured parallel to a Z axis to excite SH0 shear waves in the piezoelectric diaphragm such that an acoustic energy flow is along an X axis and main shear displacements are oriented parallel to the Z axis.

12. The pressure sensitive acoustic resonator of claim 1, wherein
    the piezoelectric diaphragm is lithium niobate with Euler angles [0°, 60° to 180°, 0°], and
    the ICP is configured to excite quasi-shear waves in the piezoelectric diaphragm such that an acoustic energy flow is along an X axis.

13. The pressure sensitive acoustic resonator of claim 1, wherein:
    the piezoelectric diaphragm is lithium niobate of a ZY-cut with a crystalline Z axis normal to the front and back surfaces of the piezoelectric diaphragm, and
    the ICP is configured parallel to an X-axis to excite shear waves in the piezoelectric diaphragm such that an acoustic energy flow is along the Z axis.

14. The pressure sensitive acoustic resonator of claim 1, wherein:
    the piezoelectric diaphragm is lithium niobate with Euler angles [0°, −15° to 0°, 90°], and the ICP is configured to excite shear waves in the piezoelectric diaphragm such that acoustic shear waves propagate up and down along an axis perpendicular to the front and back surfaces of the piezoelectric diaphragm.

15. The pressure sensitive acoustic resonator of claim 1, wherein:
the piezoelectric diaphragm is lithium niobate with Euler angles [0°, 100° to 150°, 0°], and
the ICP is configured to excite shear waves in the piezoelectric diaphragm such that acoustic shear waves propagate up and down along an axis perpendicular to the front and back surfaces of the piezoelectric diaphragm.

16. A remote pressure sensing system, comprising:
a passive pressure sensor including a pressure-sensitive acoustic resonator coupled to a first antenna; and
a reader comprising:
a transmitter configured to transmit, via a second antenna, an interrogation signal to the passive pressure sensor,
a receiver configured to receive a response signal from the passive pressure sensor, and
a controller to determine an air pressure at the passive sensor based on the response signal, wherein the pressure-sensitive acoustic resonator comprises:
a conductor pattern on a planar surface of a non-piezoelectric substrate, the conductor pattern including an interdigital conductor pattern (ICP); and
a piezoelectric diaphragm having a front surface exposed to an environment and a back surface facing, but not contacting, the ICP, such that the back surface of the piezoelectric diaphragm is separated from the ICP by a gap,
wherein the piezoelectric diaphragm does not include a conductor pattern directly disposed on either the front surface or the back surface thereof,
wherein the conductor pattern comprises a single set of interleaved fingers on one surface of the non-piezoelectric substrate, and
wherein the acoustic resonator is configured as a film bulk acoustic resonator.

17. The remote pressure sensing system of claim 16, wherein the passive pressure sensor is configured to generate the response signal by reflecting at least a portion of the interrogation signal.

18. The remote pressure sensing system of claim 16, wherein a change in an air pressure on the front surface of the piezoelectric diaphragm causes the back surface of the piezoelectric diaphragm to move relative to the surface of the substrate, resulting in a corresponding change in a resonance frequency of the pressure-sensitive acoustic resonator.

19. The remote pressure sensing system of claim 18, wherein:
the interrogation signal has a frequency proximate an equilibrium resonance frequency of the pressure-sensitive acoustic resonator, and
the method further comprises determining, by the controller, an air pressure at the passive sensor based on an amplitude of the response signal.

20. The remote pressure sensing system of claim 18, wherein:
the interrogation signal is one of a frequency-swept signal and a broadband signal, and
the method further comprises determining, by the controller, an air pressure at the passive sensor based on a frequency spectrum of the response signal.

21. A method for remotely measuring pressure, comprising:
transmitting an interrogation signal to a passive pressure sensor including a pressure-sensitive acoustic resonator;
receiving a response signal from the passive pressure sensor; and
determining an air pressure at the passive sensor based on the response signal, wherein the pressure-sensitive acoustic resonator comprises:
a conductor pattern on a planar surface of a non-piezoelectric substrate, the conductor pattern including an interdigital conductor pattern (ICP); and
a piezoelectric diaphragm having a front surface exposed to an environment and a back surface facing, but not contacting, the ICP, such that the back surface of the piezoelectric diaphragm is separated from the ICP by a gap,
wherein the piezoelectric diaphragm does not include a conductor pattern directly disposed on either the front surface or the back surface thereof,
wherein the conductor pattern comprises a single set of interleaved fingers on one surface of the non-piezoelectric substrate, and
wherein the acoustic resonator is configured as a film bulk acoustic resonator.

22. The method of claim 21, wherein
a change in an air pressure on the front surface of the piezoelectric diaphragm causes the back surface of the piezoelectric diaphragm to move relative to the planar surface of the substrate, resulting in a corresponding change in a resonance frequency of the pressure-sensitive acoustic resonator, and
the method further comprises generating, by the pressure-sensitive acoustic resonator, the response signal by reflecting at least a portion of the interrogation signal.

23. The method of claim 22, wherein:
transmitting the interrogation signal comprises transmitting a signal having a frequency proximate an equilibrium resonance frequency of the pressure-sensitive acoustic resonator, and
determining an air pressure at the passive sensor comprises determining the air pressure based on an amplitude of the response signal.

24. The method of claim 22, wherein:
transmitting the interrogation signal comprises transmitting one of a frequency-swept signal and a broadband signal, and
determining an air pressure at the passive sensor comprises determining the air pressure based on a frequency spectrum of the response signal.

* * * * *